(12) United States Patent
Saito et al.

(10) Patent No.: US 8,621,658 B2
(45) Date of Patent: Dec. 31, 2013

(54) MAGNETIC FIELD OBSERVATION DEVICE AND MAGNETIC FIELD OBSERVATION METHOD

(75) Inventors: Hitoshi Saito, Akita-ken (JP); Satoru Yoshimura, Akita-ken (JP)

(73) Assignee: Akita University, Akita (JP)

( * ) Notice: Subject to any disclaimer, the term of this patent is extended or adjusted under 35 U.S.C. 154(b) by 0 days.

(21) Appl. No.: 13/819,486

(22) PCT Filed: Sep. 5, 2011

(86) PCT No.: PCT/JP2011/070146
§ 371 (c)(1),
(2), (4) Date: Mar. 21, 2013

(87) PCT Pub. No.: WO2012/029973
PCT Pub. Date: Mar. 8, 2012

(65) Prior Publication Data
US 2013/0174302 A1    Jul. 4, 2013

(30) Foreign Application Priority Data

Sep. 3, 2010    (JP) .................................. 2010-198054

(51) Int. Cl.
*G01Q 60/54*    (2010.01)
*G01Q 60/38*    (2010.01)
*G01Q 60/50*    (2010.01)

(52) U.S. Cl.
CPC ................ *G01Q 60/38* (2013.01); *G01Q 60/50* (2013.01); *G01Q 60/54* (2013.01)
USPC ........ 850/52; 850/46; 850/49; 850/5; 850/56; 850/59; 324/244; 324/210

(58) Field of Classification Search
CPC ....... G01Q 60/38; G01Q 60/50; G01Q 60/56; G01Q 70/14; G01Q 10/04; G01R 33/0385; G01R 33/323; G01R 33/02
USPC .......... 850/52, 46, 49, 5, 56, 59, 21; 324/244, 324/210
See application file for complete search history.

(56) References Cited

U.S. PATENT DOCUMENTS 5,436,448 A * 7/1995 Hosaka et al. ..................... 850/1
6,639,400 B2 * 10/2003 Abe ............................. 324/210

(Continued)

FOREIGN PATENT DOCUMENTS

JP    05-142315 A    6/1993
JP    2001-272327 A    10/2001

(Continued)

OTHER PUBLICATIONS

International Search Report; mailed Oct. 4, 2011; PCT/JP2011/070146.

*Primary Examiner* — David A Vanore
(74) *Attorney, Agent, or Firm* — Ladas & Parry LLP

(57) ABSTRACT

A magnetic-field-observation device and method for measuring magnetic force near a magnetic material specimen's surface with high resolution and detecting the polarity of the magnetic pole of specimen's surface. The device including: a probe; excitation mechanism that excites it; scanning mechanism that relatively moves the probe and specimen; alternating magnetic field generation mechanism to make the probe periodically undergo magnetization reversal and apply thereto an alternating magnetic field having magnitude not making the specimen undergo magnetization reversal; and modulation measurement mechanism for measuring degree of periodical frequency modulation of the probe's oscillation caused by its apparent spring constant periodically changed by force of periodically changed intensity and applied to the probe by alternating force through magnetic interaction between magnetizations of the probe and specimen, by frequency demodulation or by measuring intensity of one sideband wave spectrum among spectrums generated by the frequency modulation. The method performed using the device.

14 Claims, 6 Drawing Sheets

(56) References Cited

U.S. PATENT DOCUMENTS

| | | | |
|---|---|---|---|
| 8,069,492 B2* | 11/2011 | Xi et al. | 850/25 |
| 8,359,661 B2* | 1/2013 | Tachizaki et al. | 850/47 |
| 8,490,209 B2* | 7/2013 | Saito | 850/5 |
| 2001/0030536 A1* | 10/2001 | Abe | 324/244 |
| 2010/0205699 A1* | 8/2010 | Tachizaki et al. | 850/47 |
| 2011/0030109 A1* | 2/2011 | Saito | 850/5 |
| 2013/0174302 A1* | 7/2013 | Saito et al. | 850/46 |

FOREIGN PATENT DOCUMENTS

| | | |
|---|---|---|
| JP | 2002-286613 A | 10/2002 |
| WO | 2009/101991 A1 | 8/2009 |

* cited by examiner

MAGNETIC FIELD OBSERVATION DEVICE AND MAGNETIC FIELD OBSERVATION METHOD

TECHNICAL FIELD

The present invention relates to a magnetic field observation device and a magnetic field observation method.

BACKGROUND ART

As a form of a scanning probe microscope, there is a non-contact atomic force microscope (a microscope that can measure the field of force from a specimen without touching the surface of the specimen). In the vicinity of the surface of the specimen where a short-range force such as an atomic force is predominant, it is difficult for a conventional non-contact atomic force microscope to measure a long-range force such as a magnetic force. In order to measure the long-range force, it is necessary to move the probe of the microscope away from the specimen such a distance that the long-range force is predominant. However, moving the probe away from the specimen disadvantageously causes a spatial resolution to significantly degrade as compared with an atomic resolution.

On the other hand, in recent years, manufactures have fiercely competed with one another in technology for increasing the density and capacity of a magnetic recording medium that is a main component of a high-density magnetic storage device, and thus the density of the magnetic recording medium is exponentially increased. In the research and development of the magnetic recording medium described above, it is essential to use a method of observing the minute magnetic domain structure of the magnetic recording medium, and a non-contact atomic force microscope (magnetic force microscope (MFM)) that can measure a magnetic force is used. An example of the device that can be used as the magnetic force microscope (MFM) is disclosed in Patent Literature 1.

CITATION LIST

Patent Literature
Patent Literature 1: International Publication No. 2009/101991

DISCLOSURE OF THE INVENTION

Problems to be Solved by the Invention

In a magnetic recording medium that is a main component of a high-density magnetic storage device, the magnetization transition at the boundary of recording bits acts as signals, and its spatial unevenness results in a noise source. Hence, the magnetic domain observation of the recording bit boundary portion is particularly important, and a high spatial resolution equal to or less than the diameter of crystal particles constituting the magnetic recording medium is required. However, in a conventional MFM, its spatial resolution is not sufficient for the above application. Moreover, in the conventional MFM, when a magnetic force is measured, the zero point of the magnetic force is not determined due to the superposition of a surface force that is a strong attractive force acting in a short distance, and it is difficult to identify an attractive force and a repulsive force with the magnetic force alone. In other words, when the boundary portion of the recording bits is observed, in the conventional MFM, it is difficult to identify the polarity (N pole, S pole) of the magnetic pole of the surface of the magnetic recording medium due to the superposition of the surface force that is a strong attractive force acting in a short distance, with the result that it is disadvantageously difficult to clearly identify the boundary of the recording bits.

Hence, the present invention has an object to provide a magnetic field observation device and a magnetic field observation method with which it is possible to measure a magnetic force in the vicinity of the surface of a magnetic material specimen with a high spatial resolution and with which it is also possible to detect the polarity of the magnetic pole of the surface of the magnetic material specimen.

Means for Solving the Problem

The present invention will be described below.

According to a first aspect of the present invention, there is provided a magnetic field observation device that observes a stray magnetic field from a magnetic material specimen, the magnetic field observation device including: a probe that has a magnetic moment which more easily undergoes magnetization reversal than the magnetic material specimen; an excitation mechanism that excites the probe; a scanning mechanism that relatively moves the probe and the magnetic material specimen to make the probe scan a surface of the magnetic material specimen; an alternating magnetic field generation mechanism that can make the probe periodically undergo magnetization reversal and that applies, to the probe, an alternating magnetic field having such a magnitude as not to make the magnetic material specimen undergo magnetization reversal; and a modulation measurement mechanism in which a degree of periodical frequency modulation of oscillation of the probe generated by change of an apparent spring constant caused by an alternating force applied to the probe through a magnetic interaction between magnetization of the probe and magnetization of the magnetic material specimen where a direction of magnetization is periodically changed by the alternating magnetic field applied by the alternating magnetic field generation mechanism, can be measured by frequency demodulation or by measuring an intensity of one sideband wave spectrum among sideband wave spectrums generated by the frequency modulation.

Here, the "alternating force" means a force whose intensity is periodically changed by a magnetic interaction between the magnetization of the probe and the magnetization of the magnetic material specimen and which is applied to the probe. The expression "not to make the magnetic material specimen undergo magnetization reversal" means that at least a portion of the magnetic material specimen which is an observation target is prevented from undergoing magnetization reversal. For example, it means that, when the perpendicular magnetic recording medium is used as the magnetic material specimen and thus the recording layer of the perpendicular magnetic recording medium is observed, at least the magnetization of the recording layer is prevented from undergoing magnetization reversal.

The magnetic field observation device of the present invention can be preferably used when the stray magnetic field is a static magnetic field.

The magnetic moment of the probe generates a magnetic pole at the tip of the probe. The intensity of the magnetic pole of the tip of the probe is changed in proportion to the magnitude of a magnetic moment component in a direction perpendicular to the surface of the end portion.

Preferably, in the magnetic field observation device of the present invention, a product of an intensity of a residual magnetic pole of a tip of the probe that is not changed even by application of the alternating magnetic field from the alternating magnetic field generation mechanism and a gradient of the alternating magnetic field applied from the alternating magnetic field generation mechanism to the probe is lower than a product of an intensity of a magnetic pole of the tip of the probe that is changed by the application of the alternating magnetic field from the alternating magnetic field generation mechanism and a gradient of a magnetic field applied from the magnetic material specimen to the probe. Moreover, preferably, the alternating magnetic field generation mechanism is a mechanism that applies an alternating magnetic field of a spatially uniform magnitude to a measurement space between the magnetic material specimen and the probe. Furthermore, preferably, the alternating magnetic field generation mechanism is a mechanism that applies an alternating magnetic field in a direction perpendicular to an observation surface of the magnetic material specimen.

Preferably, in the magnetic field observation device of the present invention, the probe includes a soft magnetic material.

The magnetic field observation device of the present invention can be preferably used when the magnetic material specimen is a magnetic recording medium.

Preferably, the magnetic field observation device of the present invention further includes a magnetic field imaging mechanism that observes, based on the degree of the frequency modulation measured by the modulation measurement mechanism, an amplitude of the alternating force and a phase delay with respect to the alternating magnetic field generated from the alternating magnetic field generation mechanism, and that thereby images a degree of a magnitude of and a direction of a magnetic field generated from the magnetic material specimen.

According to a second aspect of the present invention, there is provided a magnetic field observation method of observing a stray magnetic field from a magnetic material specimen, the magnetic field observation method including: a scanning step of arranging a probe that undergoes magnetization reversal more easily than the magnetic material specimen on the magnetic material specimen such that it is possible to excite the probe and simultaneously make a magnetic moment of the probe periodically undergo magnetization reversal, and of scanning a surface of the magnetic material specimen with the probe while applying to the probe an alternating magnetic field having such a magnitude as not to make the magnetic material specimen undergo magnetization reversal; and a modulation measurement step of applying to the probe a force whose intensity is periodically changed by an alternating force caused by a magnetic interaction between magnetization of the probe and magnetization of the magnetic material specimen where a direction of magnetization is periodically changed by the alternating magnetic field applied by the alternating magnetic field generation mechanism, of periodically changing an apparent spring constant of the probe with the periodic force and of measuring a degree of periodical frequency modulation of oscillation of the probe caused by periodical change of the spring constant by frequency demodulation or by measuring an intensity of one sideband wave spectrum among sideband wave spectrums generated by the frequency modulation.

The magnetic field observation method of the present invention can be preferably used when the stray magnetic field is a static magnetic field.

Preferably, in the magnetic field observation method of the present invention, in the scanning step, a product of an intensity of a residual magnetic pole of a tip of the probe that is not changed even by application of the alternating magnetic field from the alternating magnetic field generation mechanism and a gradient of the alternating magnetic field applied from the alternating magnetic field generation mechanism to the probe is lower than a product of an intensity of a magnetic pole of the tip of the probe that is changed by the application of the alternating magnetic field from the alternating magnetic field generation mechanism and a gradient of a magnetic field applied from the magnetic material specimen to the probe.

Preferably, the magnetic field observation method of the present invention further includes a magnetic field imaging step of measuring, based on the degree of the frequency modulation measured in the modulation measurement step, an amplitude of the alternating force and a phase delay with respect to the alternating magnetic field generated from the alternating magnetic field generation mechanism, and of thereby imaging a degree of a magnitude of and a direction of a magnetic field generated from the magnetic material specimen.

Advantages of the Invention

According to the present invention, it is possible to measure a magnetic force in the vicinity of a surface of a magnetic material specimen with a high spatial resolution, and it is also possible to detect the polarity of the magnetic pole of the surface of the magnetic material specimen.

BRIEF DESCRIPTION OF DRAWINGS

FIG. 2 A diagram illustrating the principles of measurement by the magnetic field observation device of the present invention; FIG. 3 A diagram showing the result of observation performed by the magnetic field observation device of the present invention in the vicinity of the surface of a perpendicular magnetic recording medium.

BEST MODE FOR CARRYING OUT THE INVENTION

1. Magnetic Field Observation Device
<Configuration>

Figure 1:
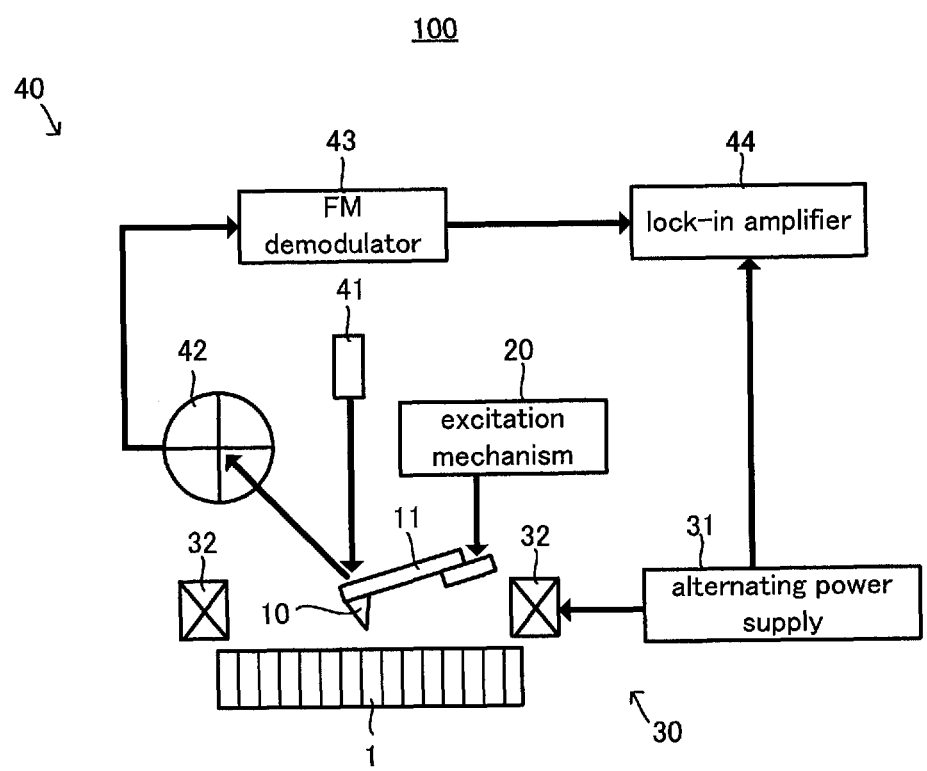
FIG. 1 A diagram schematically showing the configuration of a magnetic field observation device according to an embodiment of the present invention.

FIG. 1 is a diagram schematically showing the configuration of a magnetic field observation device 100 according to an embodiment of the present invention. The magnetic field observation device 100 is a device that observes a stray magnetic field from a magnetic material specimen 1. The magnetic field observation device 100 can be preferably used when the stray magnetic field to be observed is a static magnetic field.

As shown in FIG. 1, the magnetic field observation device 100 includes a probe 10, an excitation mechanism 20, an alternating magnetic field generation mechanism 30 and a modulation measurement mechanism 40. Although it is not shown in the figure, the magnetic field observation device 100 includes a scanning mechanism that relatively moves the probe 10 and the magnetic material specimen 1 to make the probe 10 scan the observation surface of the magnetic material specimen 1. Furthermore, the magnetic field observation device 100 preferably includes a magnetic field imaging mechanism, which will be described later. These constituent elements will be described below.

(Magnetic Material Specimen 1)

As the magnetic material specimen 1, which is the measurement target of the magnetic field observation device 100, a magnetic material is used that is unlikely to undergo magnetization reversal as compared with the probe 10. Specific examples of the magnetic material specimen 1 include a magnetic recording medium. When the magnetic recording medium is used as the magnetic material specimen 1, as will be described later, it is possible to detect the boundary of magnetic recording bits with a high spatial resolution.

(Probe 10)

As the probe 10, a probe is used that has magnetization and more easily undergo magnetization reversal than the magnetic material specimen 1. The probe 10 is arranged on the magnetic material specimen 1 and is thus affected by the stray magnetic field generated from the magnetic material specimen 1. As will be described in detail later, the magnetization of the probe 10 is periodically reversed by an alternating magnetic field generated from the alternating magnetic field generation mechanism 30. Here, an alternating force caused by a magnetic interaction between the magnetization of the probe 10 and the magnetization of the magnetic material specimen 1 adds to the probe 10 a force that periodically changes its intensity, and the apparent spring constant of the probe 10 is periodically changed. The degree of periodical frequency modulation of the oscillation of the probe 10 is measured with the modulation measurement mechanism 40, which will be described later.

As the probe 10, a probe having a low residual magnetic moment is preferably used. Specifically, a product of the intensity of the residual magnetic pole of a tip of the probe 10 that is not changed even by the application of the alternating magnetic field from the alternating magnetic field generation mechanism 30 of the probe 10 and the gradient of the alternating magnetic field applied from the alternating magnetic field generation mechanism 30 to the probe 10 is preferably lower than a product of the intensity of the magnetic pole of the tip of the probe 10 that is changed by the application of the alternating magnetic field from the alternating magnetic field generation mechanism 30 and the gradient of the magnetic field applied from the magnetic material specimen 1 to the probe 10. In order to lower the intensity of the residual magnetic pole of the probe 10, a soft magnetic material can be used as the probe 10.

In the observation of a magnetic material specimen with a conventional MFM, when a probe using a soft magnetic material is used, since the direction of the magnetic moment of the probe is changed by a stray magnetic field from the magnetic material specimen 1 and thus the direction of a magnetic field to be measured is disadvantageously changed depending on the measurement site, it is essential to use a probe using a hard magnetic material. On the other hand, in the magnetic field observation device 100, as described above, a soft magnetic material can be used as the probe 10. A soft magnetic material is used as the probe 10, and thus as compared with a Co—Cr based probe of the conventional MFM, there is an advantage that a magnetic material such as a Fe—Co alloy can be selected which can increase the detection sensitivity and in which the saturated magnetization is high. The magnetic material whose detection sensitivity is high and in which the saturated magnetization is high is used, and thus it is possible to reduce the thickness of the magnetic material thin film forming the probe 10 to 5 nm or less, with the result that a significant enhancement of the spatial resolution of the magnetic field observation device 100 is expected.

(Excitation Mechanism 20)

The probe 10 is provided in the vicinity of a tip portion (free end) of a cantilever 11, and the other tip portion (fixed end) of the cantilever 11 is fixed. The cantilever 11 described above is excited by the excitation mechanism 20 at an arbitrary frequency, and thus it is possible to excite the probe 10 at an arbitrary frequency.

As long as the mechanism can excite the probe 10 at an arbitrary frequency, the configuration of the excitation mechanism 20 is not particularly limited. For example, the excitation mechanism 20 can be constituted by an excitation actuator attached to the vicinity of the fixed end of the cantilever 11 and an alternating voltage power supply connected to the excitation actuator.

(Alternating Magnetic Field Generation Mechanism 30)

The alternating magnetic field generation mechanism 30 is a mechanism that applies to the probe 10 an alternating magnetic field of such a magnitude that the probe 10 can be made to periodically undergo magnetization reversal and that the magnetic material specimen 1 is prevented from undergoing magnetization reversal. For example, as shown in FIG. 1, the alternating magnetic field generation mechanism 30 described above can be constituted by a coil 32 that surrounds the probe 10 and an alternating power supply 31 that supplies an alternating to the coil 32.

In the alternating magnetic field generated from the alternating magnetic field generation mechanism 30, its spatial variation is preferably low. Specifically, the product of the intensity of the residual magnetic pole of the tip of the probe 10 and the gradient of the alternating magnetic field applied from the alternating magnetic field generation mechanism 30 to the probe 10 is preferably lower than the product of the intensity of the magnetic pole of the tip of the probe 10 that is changed by the application of the alternating magnetic field from the alternating magnetic field generation mechanism 30 and the gradient of the magnetic field applied from the magnetic material specimen 1 to the probe 10. In order to lower the gradient of the alternating magnetic field, an alternating magnetic field of uniform magnitude can be applied to the measurement space between the magnetic material specimen 1 and the probe 10.

The alternating magnetic field generation mechanism 30 is preferably a mechanism that applies an alternating magnetic field in a direction perpendicular to the observation surface of the magnetic material specimen 1.

Furthermore, the frequency of the alternating magnetic field generated from the alternating magnetic field generation mechanism 30 is preferably optimized to a frequency at which the magnetization reversal of the probe 10 is effectively performed so as to correspond to the magnetic material used as the probe 10.

Although the installation position of the components of the alternating magnetic field generation mechanism 30 is not particularly limited, in order for the alternating magnetic field generation mechanism 30 to be incorporated into the conventional and general-purpose MFM having a narrow space around the probe 10, a pot core for generating the alternating magnetic field and the like can be installed below the specimen installation stage of the MFM. However, in this case, when a perpendicular magnetic recording medium is used as the magnetic material specimen, the following problem may occur. Specifically, since in the perpendicular magnetic recording medium, on the surface on the side of the observation surface, a recording layer having hard magnetization and a film thickness of a few tens of nanometers is provided, and in a lower portion of the recording layer, an underlayer having soft magnetization and a film thickness of a few micrometers is provided, the intensity of the alternating magnetic field from the pot core may be attenuated by the magnetic field shield effect of this soft magnetization underlayer. Hence, the alternating magnetic field generation mechanism 30 is preferably a mechanism that can apply the alternating magnetic field to the probe 10 without the intervention of the perpendicular magnetic recording medium (the magnetic material specimen 1). Specifically, preferably, the space around the probe 10 is expanded and the alternating magnetic field generation mechanism 30 is installed so that the alternating magnetic field can be applied to the probe 10 from the side of the probe 10 with respect to the magnetic material specimen 1.

(Modulation Measurement Mechanism 40)

The alternating force caused by the magnetic interaction between the magnetization of the probe 10 and the magnetization of the magnetic material specimen 1 adds to the probe 10 a force that periodically changes its intensity. The force that periodically changes its intensity periodically changes the apparent spring constant of the probe 10. As described above, the apparent spring constant of the probe 10 is periodically changed, and thus the frequency of the oscillation of the probe 10 is periodically modulated. The modulation measurement mechanism 40 is a mechanism that can measure the degree of the periodical frequency modulation of the oscillation of the probe 10 by frequency demodulation or by measuring the intensity of one sideband wave spectrum among sideband wave spectrums generated by the frequency modulation.

The modulation measurement mechanism 40 formed as shown in FIG. 1 includes: a light source 41 that irradiates laser light to the tip of the cantilever 11 on the side of the free end; an optical displacement sensor 42 that detects the laser light reflected off the cantilever 11; an FM demodulator 43 that is constituted as a demodulation device by an analogue circuit or a digital circuit; and a lock-in amplifier 44 that serves as a intensity measurement device. The modulation measurement mechanism 40 may include a phase detection circuit or an amplitude detection circuit that is a function of a conventional magnetic force microscope.

The laser light irradiated from the light source 41 and reflected off the tip of the cantilever 11 on the side of the free end is detected by the optical displacement sensor 42, and thus it is possible to acquire the displacement of the probe 10 as an output. The output from the optical displacement sensor 42 that is detected while the observation surface of the magnetic material specimen 1 is being scanned with the probe 10 by the following scanning mechanism is input to the FM demodulator 43. The output terminal of the FM demodulator 43 is connected to the input signal terminal of the lock-in amplifier 44, and the voltage signal of the alternating power supply 31 provided in the alternating magnetic field generation mechanism 30 is connected to the reference signal terminal of the lock-in amplifier 44. An amplifier may be provided between the optical displacement sensor 42 and the FM demodulator 43, and a signal from the optical displacement sensor 42 may be input through the amplifier to the FM demodulator 43. The amplitude and the phase of a frequency demodulation signal demodulated by the FM demodulator 43 can be measured with the lock-in amplifier 44. As the FM demodulator 43, a PLL circuit (phase locked loop circuit) can be used.

With the modulation measurement mechanism 40, it is possible to measure, as described above, the degree of the periodical frequency modulation of the oscillation of the probe 10 by frequency demodulation. Moreover, with the following method, it is possible to measure the degree of the periodical frequency modulation of the oscillation of the probe 10 by measuring the intensity of one sideband wave spectrum among the sideband wave spectrums generated by the frequency modulation. The intensity of the spectrum is generally measured with a spectrum analyzer (which measures, for a frequency, the intensity or the like of a signal or the like). The intensity of the sideband wave spectrum can be measured with a spectrum analyzer, for example, at A point or B point shown in FIG. 1.

The method of performing the measurement at A point is a method of selecting one of the sideband wave spectrums before the frequency demodulation and performing the measurement. The resonant frequency $\omega_o$ of the probe 10 depends, as shown in formula (4) described later, on the magnetic field gradient $(\partial H_z^{dc}/\partial z)$ of a perpendicular magnetic field $H_z^{dc}$ from the magnetic material specimen 1 at the position of the probe 10 or the like, and is given by the below formula. Here, since sideband wave spectrums appear at $\omega_o \pm \omega_m$, one of the sideband wave spectrums is selected and measured.

[Mathematical formula 1]

$$\omega_0 = \sqrt{\frac{k_0 + q_{tip}^{dc}\frac{\partial H_z^{dc}}{\partial z} + \frac{q_{tip}^{ac}}{2}\frac{\partial H_z^{ac}}{\partial z}}{m}} \qquad (※)$$

The resonant frequency $\omega_o$ changes depending on the observation site (the position of the probe 10). Accordingly, when the method of performing the measurement at A point is used, an error is increased unless the change of $\omega_o$ is corrected; and therefore it is difficult to accurately measure the sideband wave spectrum as compared with the method of performing the measurement at B point, which will be described later.

The method of performing the measurement at B point is a method of selecting the source signal of the frequency modulation extracted by the frequency demodulation and performing the measurement. In this method, there is no influence from the change of $\omega_o$ depending on the observation site (the position of the probe 10). As such, since it is not necessary to correct the change of $\omega_o$, the accurate measurement of the sideband wave spectrum is performed more easily than the case where the measurement is performed at A point. On the other hand, when the method of performing the measurement at B point is used, the frequency is lowered than the case where the measurement is performed at A point; and thus it takes longer to perform the measurement. However, in the actual measurement, there is almost no adverse effect resulting from such a longer measurement time.

(Scanning Mechanism)

The scanning mechanism is a mechanism that can relatively change the positions of the probe 10 and the magnetic material specimen 1. As the scanning mechanism, for example, a mechanism can be used in which a specimen installation stage where the magnetic material specimen 1 is placed is moved by a drive device to thereby relatively change the position of the specimen installation stage with respect to the probe 10, and thus the positions of the probe 10 and the magnetic material specimen 1 can be relatively changed.

However, the scanning mechanism provided in the magnetic field observation device 100 is not limited to the form described above; a mechanism is preferably used in which the movement of the probe 10 or the magnetic material specimen 1 is controlled and thus the positions of the probe 10 and the magnetic material specimen 1 can be relatively changed. As the scanning mechanism, a known mechanism (for example, a piezoelectric element) used in a conventional scanning probe microscope or the like can be used.

(Magnetic Field Imaging Mechanism)

The magnetic field imaging mechanism is a mechanism that observes, based on the degree of the frequency modulation measured by the modulation measurement mechanism 40, the amplitude of the alternating force caused by the magnetic interaction between the magnetization of the probe 10 and the magnetization of the magnetic material specimen 1 and a phase delay with respect to the alternating magnetic field generated from the alternating magnetic field generation mechanism 30, and that thereby images the degree of the magnitude of and the direction of a static magnetic field generated from the magnetic material specimen 1.

The magnetic field imaging mechanism is not particularly limited as long as the mechanism can image, as described above, the result of the measurement performed by the modulation measurement mechanism 40. As the magnetic field imaging mechanism, for example, a display device can be used which is provided in a conventional scanning microscope and which can image an external input signal.

<Measurement Principles>

Principles in which it is possible to measure a magnetic force using the magnetic field observation device 100 of the present invention in the vicinity of the surface of the magnetic material specimen 1 with a high resolution and in which it is also possible to detect the magnetic pole of the surface of the magnetic material specimen 1 will be described below.

Figure 2A:
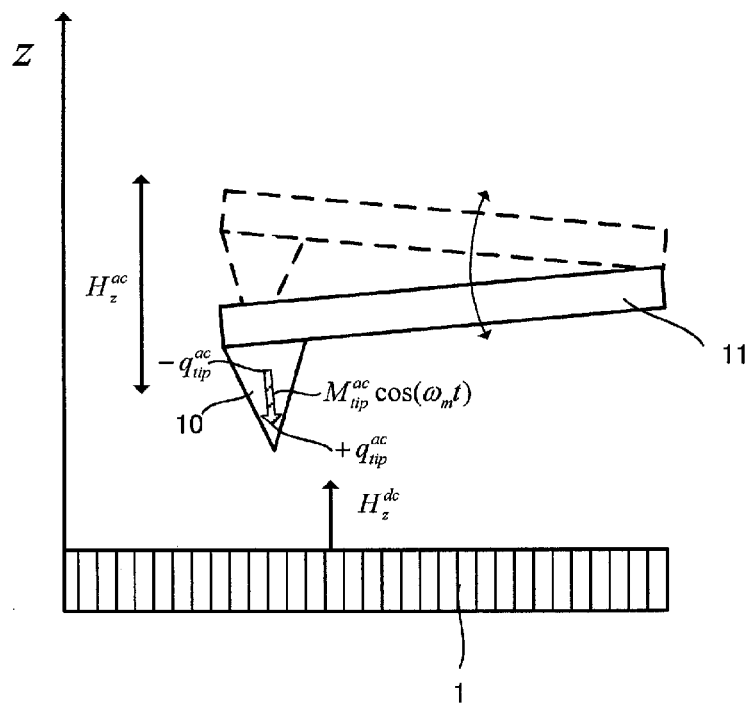
FIG. 2A schematically shows how an alternating magnetic field having a frequency different from the resonant frequency of the probe 10 is applied to the probe 10 oscillating at a constant frequency.
Figure 2B:
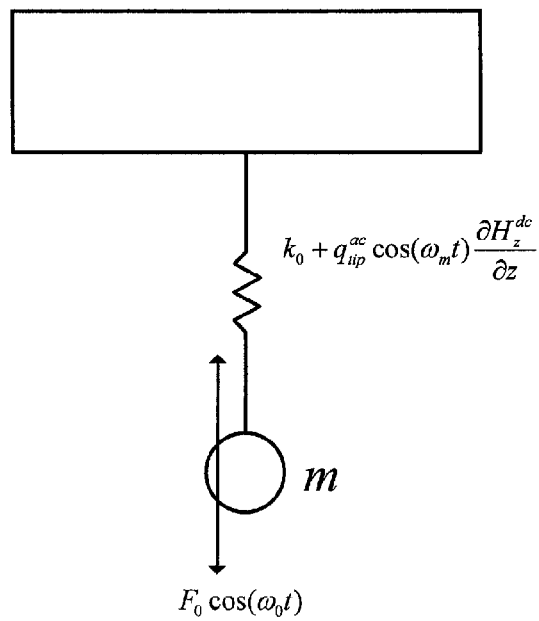
FIG. 2B schematically shows a model in which the movement of the probe 10 described above is regarded as a spring where a weight of a mass m is attached to its tip.

As described above, the frequency of the oscillation of the probe 10 is periodically modulated due to the alternating force caused by the magnetic interaction between the magnetization of the probe 10 and the magnetization of the magnetic material specimen 1. Its theoretical model is shown in FIG. 2. FIG. 2A schematically shows how an alternating magnetic field having a frequency different from the resonant frequency of the probe 10 is applied to the probe 10 oscillating at a constant frequency. FIG. 2B schematically shows a model in which the movement of the probe 10 described above is regarded as a spring where a weight of a mass m is attached to its tip.

A frequency modulation phenomenon where the alternating force in the oscillation of the probe 10 is a modulation source is derived by considering the movement (formula (1) below) of a harmonic oscillator whose spring constant as shown in FIG. 2 is periodically changed by the alternating force.

[Mathematical formula 2]

$$m\frac{d^2 z(t)}{dt^2} + m\gamma\frac{dz(t)}{dt} + (k_0 + \Delta k\cos(\omega_m t))z(t) = F_0\cos(\omega_0 t) \quad (1)$$

(m: the effective mass of the probe 10, t: time, z: the amplitude of the probe 10, $\gamma$: attenuation coefficient, $k_0$: the spring constant of the cantilever 11 before the application of the alternating force to the probe 10, $\Delta k$: the amount of change of the effective spring constant of the cantilever 11 by the application of the alternating force to the probe 10, $\omega_m$: oscillation angular frequency, $F_0$: the amplitude of an oscillation force, and $\omega_0$: the resonant angular frequency).

Here, consider a case where the probe 10 is excited at the resonant angular frequency $\omega_0$.

$\Delta k \cos(\omega_m t) = k_{\it{eff}}$ indicates the change of the effective spring constant by the alternating force, and its solution is given by the formula (2) below when $\Delta k \ll k_0$.

[Mathematical formula 3]

$$z(t) \cong \left(\frac{F_0}{m\gamma\omega_0}\right)\sin\left(\omega_0 t + \left(\frac{\Delta k}{m\gamma\omega_0}\right)\cos(\omega_m t)\right) \quad (2)$$

$$= \left(\frac{F_0}{m\gamma\omega_0}\right)\sin(\omega_0 t) +$$

$$\frac{\Delta k F_0}{2(m\gamma\omega_0)^2}(\cos((\omega_0 + \omega_m)t) + \cos((\omega_0 - \omega_m)t))$$

The formula (2) above shows that the alternating force serves as a generation source and frequency modulation is generated in the oscillation of the probe 10. Here, consider that a soft magnetic material is used as the probe 10 and an alternating magnetic field of the angular frequency $\omega_m$ is applied to the probe 10 without disturbing the magnetized state of the magnetic material specimen 1, and thus the magnetization of the probe 10 is periodically reversed. When the magnetic pole of the tip of the probe 10 receiving a static magnetic field $H_z^{dc}$ in a direction perpendicular to the observation surface of the magnetic material specimen 1 is changed by an alternating magnetic field $H_z^{ac} \cos(\omega_m t)$ in the direction perpendicular to the observation surface of the magnetic material specimen 1 as shown in the formula (3) below, the change $k_{\it{eff}}$ of the effective spring constant of the probe 10 is given by the formula (4) below. Here, the intensity of the magnetic pole of the tip of the probe 10 is changed in proportion to the magnitude of a component in a direction perpendicular to the specimen surface of the magnetic moment of the probe 10.

[Mathematical Formula 4]

$$q_{tip} = q_{tip}^{dc} + q_{tip}^{ac}\cos(\omega_m t) \quad (3)$$

($q_{tip}$: the magnetic pole of the tip of the probe 10, $q_{tip}^{dc}$: a residual static magnetic pole like a direct current (dc) that is not changed by the alternating magnetic field of the tip of the probe 10. This residual magnetic pole is in proportion to the residual magnetic moment of the probe in the Z direction. $q_{tip}^{ac}$: an alternating magnetic pole like an alternating current (ac) that is periodically changed by the alternating magnetic field of the tip of the probe 10. This magnetic pole is in proportion to a component of the magnetic moment of the probe in the Z direction that is changed by the alternating magnetic field.)

[Mathematical formula 5]

$$k_{\it{eff}} = q_{tip}\frac{\partial H_z}{\partial z} = (q_{tip}^{dc} + q_{tip}^{ac}\cos(\omega_m t))\left(\frac{\partial H_z^{dc}}{\partial z} + \frac{\partial H_z^{ac}}{\partial z}\cos(\omega_m t)\right) \quad (4)$$

$$= \left(q_{tip}^{dc}\frac{\partial H_z^{dc}}{\partial z} + \frac{q_{tip}^{ac}}{2}\frac{\partial H_z^{ac}}{\partial z}\right) +$$

$$\left(q_{tip}^{ac}\frac{\partial H_z^{dc}}{\partial z} + q_{tip}^{dc}\frac{\partial H_z^{ac}}{\partial z}\right)\cos(\omega_m t) + \frac{q_{tip}^{ac}}{2}\frac{\partial H_z^{ac}}{\partial z}\cos(2\omega_m t)$$

($H_z$: a component of a magnetic field in a direction of displacement of the probe 10 applied to the probe 10. The direction of displacement of the probe 10 is the Z direction perpendicular to the specimen surface as shown in FIG. 2A.)

The product of the intensity of the residual magnetic pole of the tip of the probe 10 and the gradient of the alternating magnetic field applied to the probe 10 is reduced, and thus the formula (5) below is satisfied, with the result that the second term of the formula (4) is expressed by the formula (6) below.

[Mathematical formula 6]

$$\left| q_{tip}^{ac} \frac{\partial H_z^{dc}}{\partial z} \right| \gg \left| q_{tip}^{dc} \frac{\partial H_z^{ac}}{\partial z} \right| \qquad (5)$$

[Mathematical formula 7]

$$k_{eff} = q_{tip}^{ac} \cos(\omega_m t) \left( \frac{\partial H_z^{dc}}{\partial z} \right) = \Delta k \cos(\omega_m t) \qquad (6)$$

Hence, it is understood that, after the frequency modulation signal of the oscillation of the probe 10 generated by the application of the alternating magnetic field is subjected to frequency demodulation under these conditions, the frequency demodulation signal is subjected to lock-in detection at the angular frequency $\omega_m$ of the alternating power supply 31, using the lock-in amplifier 44, with an output to the alternating power supply 31 provided in the alternating magnetic field generation mechanism 30 as the reference signal, and thus it is possible to perform, in the vicinity of the specimen surface, the measurement of the magnetic field gradient ($\partial H_z^{dc}/\partial z$) of the perpendicular magnetic field $H_z^{dc}$ from the magnetic material specimen 1.

Here, the sign (upward polarity, downward polarity) of $H_z^{dc}$ reflects the polarity (N pole, S pole) of the surface magnetic pole of the magnetic material specimen 1, and when the sign is reversed, the change $k_{eff}$ of the effective spring constant is made as shown in the formula (7) below, and the phase is changed by 180°.

[Mathematical formula 8]

$$k_{eff} = q_{tip}^{ac} \left( \frac{\partial (-H_z^{dc})}{\partial z} \right) \cos(\omega_m t) = q_{tip}^{ac} \left( \frac{\partial (H_z^{dc})}{\partial z} \right) \cos(\omega_m t - \pi) \qquad (7)$$

Thus, it is also possible to directly detect the sign (upward polarity, downward polarity) of $H_z^{dc}$ reflecting the polarity (N pole, S pole) of the surface magnetic pole of the magnetic material specimen 1.

Since, in the formula (5) above, its left-hand side is a necessary signal, and its right-hand side is an unnecessary signal, and corresponds to noise. In the present invention, the necessary signal is large with respect to the noise, and the ratio (the necessary signal/the noise) of the necessary signal to the noise is preferably 3 or more and is more preferably 9 or more. Hence, for example, in order to set the ratio of the necessary signal to the noise at 9, it is necessary to satisfy the formula (8) below.

[Mathematical formula 9]

$$\left| q_{tip}^{ac} \frac{\partial H_z^{dc}}{\partial z} \right| \geq 9 \left| q_{tip}^{dc} \frac{\partial H_z^{ac}}{\partial z} \right| \qquad (8)$$

Since in the formula (8) above, ($\partial H_z^{dc}/\partial z$) reflects the magnetic unevenness of the magnetic material specimen 1, it varies with the measurement site on a nanoscale; on the other hand, since ($\partial H_z^{ac}/\partial z$) reflects the size of the coil 32 to vary with the measurement site on a millisize, the effect of the noise on the minute magnetic domain structure is generally small.

As described above, with the magnetic field observation device of the present invention, it is possible to observe the minute magnetic domain structure of the magnetic material specimen having hard magnetization, such as a magnetic recording medium that generates a static magnetic field. The magnetic material exhibiting hard magnetization has the feature of showing a minute magnetic domain structure as compared with the magnetic material exhibiting soft magnetization. Hence, the magnetic field observation device of the present invention that can observe the minute magnetic domain structure of the magnetic material specimen having hard magnetization has versatility. Moreover, with the magnetic field observation device of the present invention, it is possible to obtain, as in a measurement in a vacuum, a high measurement sensitivity even in a measurement in the air.

2. Magnetic Field Observation Method

The magnetic field observation method of the present invention will now be described.

The magnetic field observation method of the present invention is a method of observing a stray magnetic field from a magnetic material specimen, and includes a scanning step and a modulation measurement step, which will be described later. The magnetic field observation method of the present invention can be performed with, for example, the magnetic field observation device 100 of the present invention described above. The scanning step and the modulation measurement step will be described with reference to FIG. 1.

(Scanning Step)

The scanning step is a step in which the probe 10 that undergoes magnetization reversal more easily than the magnetic material specimen 1 is arranged on the magnetic material specimen 1, and it is possible to excite the probe 10 and simultaneously make the probe 10 periodically undergo magnetization reversal and in which, while an alternating magnetic field having such a magnitude as not to make the magnetic material specimen 1 undergo magnetization reversal is being applied to the probe 10, the surface of the magnetic material specimen 1 is scanned with the probe 10. The excitation of the probe 10 can be performed by the excitation mechanism 20 described above. The application of the alternating magnetic field to the probe 10 can be performed by the alternating magnetic field generation mechanism 30 described above. Furthermore, the scanning of the surface of the magnetic material specimen 1 with the probe 10 can be performed by the scanning mechanism described above.

(Modulation Measurement Step)

The modulation measurement step is a step in which a force whose intensity is periodically changed by the alternating force caused by the magnetic interaction between the magnetization of the probe 10 and the magnetization of the magnetic material specimen 1 is applied to the probe 10, the apparent spring constant of the probe 10 is periodically changed by the periodical attractive force and repulsive force and the degree of the periodical frequency modulation of the oscillation of the probe 10 caused by the periodical change of the spring constant is measured by frequency demodulation or by measuring the intensity of one sideband wave spectrum among sideband wave spectrums generated by frequency modulation. The measurement described above can be performed by the modulation measurement mechanism 40 described above.

The magnetic field observation method of the present invention can be preferably used for the observation of a static magnetic field. In the scanning step, the product of the intensity of the residual magnetic pole of the tip of the probe 10 and the gradient of the alternating magnetic field applied from the alternating magnetic field generation mechanism 30 to the probe 10 is preferably lower than the product of the intensity of the magnetic pole of the tip of the probe 10 that is changed by the application of the alternating magnetic field from the alternating magnetic field generation mechanism 30 and the gradient of the magnetic field applied from the magnetic material specimen 1 to the probe 10. Furthermore, a magnetic field imaging step is preferably provided in which, based on the degree of the frequency modulation measured in the modulation measurement step, the amplitude of the alternating force caused by the magnetic interaction between the magnetization of the probe 10 and the magnetization of the magnetic material specimen 1 and the phase delay with respect to the alternating magnetic field generated from the alternating magnetic field generation mechanism are measured, and thereby the degree of the magnitude of and the direction of the magnetic field generated from the magnetic material specimen 1 are imaged.

EXAMPLE

Although the present invention will be described below in further detail using an example, the present invention is not limited to this example.

The stray magnetic field from the magnetic material specimen was observed with the magnetic field observation device of the present invention. As the magnetic material specimen, a CoCrPt—SiO$_2$ based perpendicular magnetic recording medium was used. The magnetic field observation device of the present invention was configured as follows: with a commercially available MFM (a scanning probe microscope made by Japan Electron Optics Laboratory Ltd., JSPM-5400) as a base, as the alternating magnetic field generation mechanism, a pot core made of soft magnetic ferrite and an alternating voltage power supply that supplied power to the pot core were added, and furthermore, an FM demodulator (easy-PLL made by Nanosurf Company) was added as part of the modulation measurement mechanism. The pot core was installed below the specimen installation stage of the MFM. The amplitude of the alternating magnetic field generated from the pot core was about 50 Oe and the frequency thereof was 100 Hz. As the probe, a soft magnetic probe obtained by forming a permalloy thin film in a thickness of about 20 nm thick on the surface of a Si probe was used. The retention power of the soft magnetic probe was about 50 Oe. The distance between the probe and the observation surface of the magnetic material specimen when the observation was performed was 10 nm.

The magnetic moment of the soft magnetic probe was periodically reversed by the alternating magnetic field from the pot core without changing the magnetic moment of the recording layer of the perpendicular magnetic recording medium. A tapping-lift mode was used to acquire the surface shape image of the observation surface (the surface on the side of the recording layer) of the magnetic material specimen, then the frequency modulation signal of the probe oscillation generated by the application of the alternating magnetic field was subjected to frequency demodulation using the FM demodulator, the lock-in detection was performed using the alternating voltage power supply connected to the pot core as the reference signal and static magnetic field information on the recording layer of the perpendicular magnetic recording medium was obtained from the amplitude image and the phase image of an alternating magnetic force.

FIG. 3 shows the result of the observation in the vicinity of the surface of the perpendicular magnetic recording medium. FIG. 3A is an image obtained by imaging the intensity of the perpendicular magnetic field (the magnetic field perpendicular to the observation surface) from the perpendicular magnetic recording medium; FIG. 3B is an image obtained by imaging the phase difference of the alternating force for the alternating voltage power supply connected to the pot core. FIG. 3C shows the line profile of the image of FIG. 3A; FIG. 3D shows the line profile of the image of FIG. 3B. In the normal observation mode of the MFM, it was impossible to detect the magnetic field because the observation was performed in the vicinity of the specimen surface.

Figure 3A:
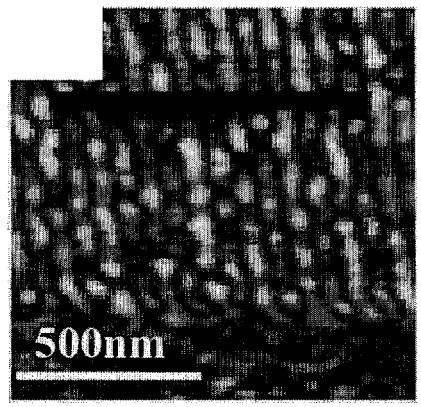
FIG. 3A is an image obtained by imaging the strength of the perpendicular magnetic field (the magnetic field perpendicular to the observation surface) from the perpendicular magnetic recording medium.
Figure 3B:
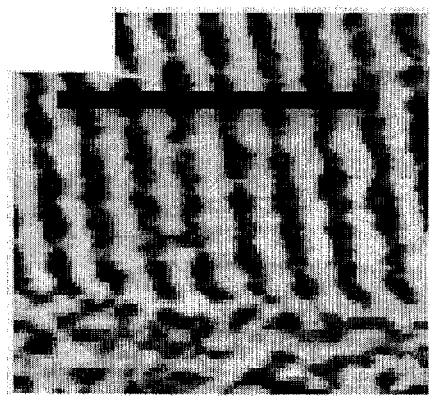
FIG. 3B is an image obtained by imaging the phase difference of the alternating force for the alternating voltage power supply connected to the pot core.
Figure 3C:
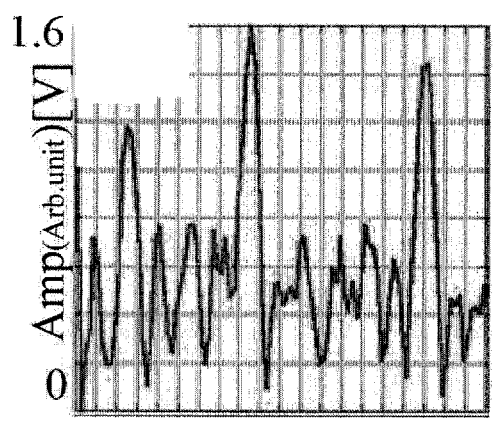
FIG. 3C shows the line profile of the image of FIG. 3A.
Figure 3D:
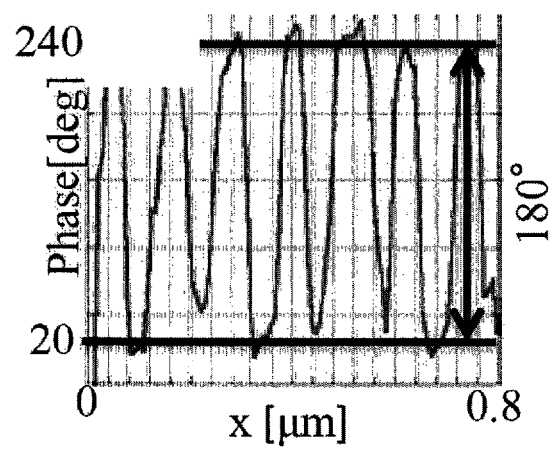
FIG. 3D shows the line profile of the image of FIG. 3B.

FIG. 3B shows a binary image of light and dark contrast. FIG. 3B shows that, since its phase difference is 180°, the direction of the perpendicular magnetic field generated from the perpendicular magnetic recording medium is opposite as in an upward direction/downward direction. In other words, it shows that the N pole and S pole of the surface of the perpendicular magnetic recording medium generating the magnetic field were clearly identified. This result indicates that the surface magnetic pole of the magnetic material specimen was successfully and directly detected with a MFM for the first time. It is found that, in the recording part, the boundary of the light and dark contrast thereof is the boundary of the recording bits, and thus it is possible to clearly observe its position. As described above, in the present invention, it is possible to directly observe the polarity of the surface magnetic pole, which is conventionally difficult to directly observe.

When the perpendicular magnetic field intensity image of FIG. 3A and the magnetic field phase image of FIG. 3B are compared, it is found that the dark contrast where the magnetic field intensity is a zero value is shown in the boundary of the light and dark contrast of the magnetic field phase image. Thus, it is confirmed that the boundary of the recording bits can be clearly observed even in the magnetic field intensity image.

Furthermore, in the perpendicular magnetic field intensity image of FIG. 3A, the magnetic field intensity is varied in the shape of particles, and magnetic unevenness that is estimated to have resulted from a magnetic cluster formed with a plurality of crystal particles coupled magnetically and causing noise is clearly observed.

As described above, in the present invention, it is also possible to detect the magnetic force in the vicinity of the observation surface of the magnetic material specimen, and thus it is possible to expect the enhancement of the spatial resolution. It is also possible to clearly image the magnetic unevenness of a medium that is important for the research and development of a magnetic recording medium.

Although the present invention has been described using the embodiment that is considered to be the most practical and preferable at this time, the present invention is not limited to the embodiment disclosed in the specification of the present application. Modifications are possible as necessary without departing from the outline and spirit of the invention that can be collectively read from the scope of claims and the specification. It should be understood that the magnetic field observation devices and the magnetic field observation methods involving such modifications are also included in the technical scope of the present invention.

INDUSTRIAL APPLICABILITY

The magnetic field observation device and the magnetic field observation method of the present invention can be used in, for example, the manufacturing process of a magnetic recording medium.

LIST OF REFERENCE SYMBOLS 1 magnetic material specimen
10 probe
11 cantilever
20 excitation mechanism
30 alternating magnetic field generation mechanism
31 alternating power supply
32 coil
40 modulation measurement mechanism
41 light source
42 optical displacement sensor
43 FM demodulator
44 lock-in amplifier

The invention claimed is:

1. A magnetic field observation device that observes a stray magnetic field from a magnetic material specimen, the magnetic field observation device comprising:
a probe that has a magnetic moment which more easily undergoes magnetization reversal than the magnetic material specimen;
an excitation mechanism that excites the probe;
a scanning mechanism that relatively moves the probe and the magnetic material specimen to make the probe scan a surface of the magnetic material specimen;
an alternating magnetic field generation mechanism that can make the probe periodically undergo magnetization reversal and that applies, to the probe, an alternating magnetic field having such a magnitude as not to make the magnetic material specimen undergo magnetization reversal; and
a modulation measurement mechanism in which a degree of periodical frequency modulation of oscillation of the probe generated by change of an apparent spring constant caused by an alternating force applied to the probe through a magnetic interaction between magnetization of the probe and magnetization of the magnetic material specimen where a direction of magnetization is periodically changed by the alternating magnetic field applied by the alternating magnetic field generation mechanism can be measured by frequency demodulation or by measuring an intensity of one sideband wave spectrum among sideband wave spectrums generated by the frequency modulation,
wherein a product of an intensity of a residual magnetic pole of a tip of the probe that is not changed even by application of the alternating magnetic field from the alternating magnetic field generation mechanism and a gradient of the alternating magnetic field applied from the alternating magnetic field generation mechanism to the probe is smaller than a product of an intensity of a magnetic pole of the tip of the probe that is changed by the application of the alternating magnetic field from the alternating magnetic field generation mechanism and a gradient of a magnetic field applied from the magnetic material specimen to the probe.

2. The magnetic field observation device of claim 1, wherein the stray magnetic field is a static magnetic field.

3. The magnetic field observation device of claim 1, wherein the alternating magnetic field generation mechanism is a mechanism that applies an alternating magnetic field of a spatially uniform magnitude to a measurement space between the magnetic material specimen and the probe.

4. The magnetic field observation device of claim 1, wherein the alternating magnetic field generation mechanism is a mechanism that applies an alternating magnetic field in a direction perpendicular to an observation surface of the magnetic material specimen.

5. The magnetic field observation device of claim 1, wherein the probe includes a soft magnetic material.

6. The magnetic field observation device of claim 1, wherein the magnetic material specimen is a magnetic recording medium.

7. The magnetic field observation device of claim 1, the magnetic field observation device further comprising:
a magnetic field imaging mechanism that observes, based on the degree of the frequency modulation measured by the modulation measurement mechanism, an amplitude of the alternating force and a phase delay with respect to the alternating magnetic field generated from the alternating magnetic field generation mechanism, and that thereby images a degree of a magnitude of and a direction of a static magnetic field generated from the magnetic material specimen.

8. The magnetic field observation device of claim 1, wherein the modulation measurement mechanism comprises: a sensor which detects displacement of the probe, and an FM demodulator which demodulates a frequency modulation signal obtained from the sensor; and is capable of measuring a magnetic field gradient of the stray magnetic field, from a frequency demodulation signal obtained from the FM demodulator and a voltage signal of the alternating magnetic field generation mechanism.

9. The magnetic field observation device of claim 1, wherein a product of an intensity of a magnetic pole of the tip of the probe that is changed by application of the alternating magnetic field from the alternating magnetic field generation mechanism and a gradient of a magnetic field applied from the magnetic material specimen to the probe is nine times or more larger than a product of an intensity of a residual magnetic pole of the tip of the probe that is not changed even by application of the alternating magnetic field from the alternating magnetic field generation mechanism and a gradient of the alternating magnetic field applied from the alternating magnetic field generation mechanism to the probe.

10. A magnetic field observation method of observing a stray magnetic field from a magnetic material specimen, the magnetic field observation method comprising:
a scanning step of arranging a probe that undergoes magnetization reversal more easily than the magnetic material specimen on the magnetic material specimen such that it is possible to excite the probe and simultaneously make a magnetic moment of the probe periodically undergo magnetization reversal, and of scanning a surface of the magnetic material specimen with the probe while applying to the probe an alternating magnetic field having such a magnitude as not to make the magnetic material specimen undergo magnetization reversal; and
a modulation measurement step of applying to the probe a force whose intensity is periodically changed by an alternating force caused by a magnetic interaction between magnetization of the probe and magnetization of the magnetic material specimen where a direction of magnetization of the probe is periodically changed by the alternating magnetic field applied by the alternating magnetic field generation mechanism, of periodically changing an apparent spring constant of the probe with the periodic force and of measuring a degree of periodical frequency modulation of oscillation of the probe caused by periodical change of the spring constant by frequency demodulation or by measuring an intensity of one sideband wave spectrum among sideband wave spectrums generated by the frequency modulation, wherein, in the scanning step, a product of an intensity of a residual magnetic pole of a tip of the probe that is not changed even by application of the alternating magnetic field from the alternating magnetic field generation mechanism and a gradient of the alternating magnetic field applied from the alternating magnetic field generation mechanism to the probe is smaller than a product of an intensity of a magnetic pole of the tip of the probe that is changed by the application of the alternating magnetic field from the alternating magnetic field generation mechanism and a gradient of a magnetic field applied from the magnetic material specimen to the probe.

11. The magnetic field observation method of claim 10, wherein the stray magnetic field is a static magnetic field.

12. The magnetic field observation method of claim 10, the magnetic field observation method further comprising:

a magnetic field imaging step of observing, based on the degree of the frequency modulation measured in the modulation measurement step, an amplitude of the alternating force and a phase delay with respect to the alternating magnetic field generated from the alternating magnetic field generation mechanism, and of thereby imaging a degree of a magnitude of and a direction of a magnetic field generated from the magnetic material specimen.

13. The magnetic field observation method of claim 10, wherein in the modulation measurement step, displacement of the probe is detected by a sensor, a frequency modulation signal obtained from the sensor is demodulated by an FM demodulator, and a magnetic field gradient of the stray magnetic field is measured from a frequency demodulation signal obtained from the FM demodulator and a voltage signal of the alternating magnetic field generation mechanism.

14. The magnetic field observation method of claim 10, wherein in the scanning step a product of an intensity of a magnetic pole of the tip of the probe that is changed by application of the alternating magnetic field from the alternating magnetic field generation mechanism and a gradient of a magnetic field applied from the magnetic material specimen to the probe is nine times or more larger than a product of an intensity of a residual magnetic pole of the tip of the probe that is not changed even by application of the alternating magnetic field from the alternating magnetic field generation mechanism and a gradient of the alternating magnetic field applied from the alternating magnetic field generation mechanism to the probe.

* * * * *